United States Patent
Liu et al.

(10) Patent No.: US 6,500,749 B1
(45) Date of Patent: Dec. 31, 2002

(54) METHOD TO IMPROVE COPPER VIA ELECTROMIGRATION (EM) RESISTANCE

(75) Inventors: Chung-Shi Liu, HsinChu (TW); Shau-Lin Shue, Hsinchu (TW); Chen-Hua Yu, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/810,123

(22) Filed: Mar. 19, 2001

(51) Int. Cl.⁷ .......................................... H01L 21/4763
(52) U.S. Cl. ...................... 438/618; 438/694; 438/687; 438/689
(58) Field of Search .................................. 438/618, 627, 438/637, 639, 358, 659, 674, 675, 687, 689, 690, 691, 692, 693, 694; 216/17, 18; 257/724, 762

(56) References Cited

U.S. PATENT DOCUMENTS

| 6,022,808 A | 2/2000 | Nogami et al. ............. 438/694 |
| 6,057,223 A | 5/2000 | Lanford et al. ............. 438/618 |
| 6,096,648 A | 8/2000 | Lopatin et al. ............. 438/687 |
| 6,117,770 A * | 9/2000 | Pramanick et al. ......... 438/659 |
| 6,268,291 B1 * | 7/2001 | Andmanick et al. ........ 438/659 |

OTHER PUBLICATIONS

Wolf and Tauber; "Silicon Processing for the VLSI Era vol. 1: Process Technology", pp. 323 and 409; copyright 1986 Lattice Press; Sunset Beach, CA.*

* cited by examiner

Primary Examiner—Wael Fahmy
Assistant Examiner—Fernando Toledo
(74) Attorney, Agent, or Firm—George O. Saile; Stephen B. Ackerman; Stephen G. Stanton

(57) ABSTRACT

A method to fabricate a metal via structure having improved electromigration resistance, comprising the following steps. A semiconductor structure having an exposed metal interconnect structure therein is provided. The metal interconnect structure including a metal via portion. A capping layer is formed over the metal interconnect structure. A via pattern structure is formed over the capping layer. The via pattern structure having a via pattern hole aligned with the metal via portion of the metal interconnect structure. Ions are implanted through the via pattern hole into the metal via portion, and any portion of the metal interconnect structure above the metal via portion. Whereby the metal via portion and the portion of the metal interconnect structure above the metal via portion have improved electromigration resistance.

31 Claims, 2 Drawing Sheets

METHOD TO IMPROVE COPPER VIA ELECTROMIGRATION (EM) RESISTANCE

FIELD OF THE INVENTION

The present invention relates generally to semiconductor devices and more specifically to methods of fabricating copper vias having improved electromigration (EM) resistance.

BACKGROUND OF THE INVENTION

With the shrinking of dimensions, or design rule, in semiconductor devices, a greater challenge is occurring in copper (Cu) via electromigration (EM).

U.S. Pat. No. 6,096,648 to Lopatin et al. describes a copper damascene process with an impurity, e.g. Mg, implanted into copper lines to form a doped copper line interconnect. The implanted ions are activated by a subsequent annealing or deposited step that requires an elevated temperature.

Copper alloy, e.g. CuMg ~2% and CuAl ~1% with a resistivity of ~2 μOhm-cm), has been widely studied to improve Cu line performance against Cu oxidation by the self-passivation layer formation, i.e. e.g. MgO or $Al_2O_3$, respectively, at the copper surface which also improves EM.

For example, U.S. Pat. No. 6,057,223 to Lanford et al. describes a copper damascene process by: forming a metal layer on the surface of a microelectronics substrate; forming a copper layer upon the metal layer; and annealing the metal and copper layers which diffuses at least some of the metal layer through the copper layer to the surface of the copper layer where the diffused metal ions forms a protective metal oxide at the surface of the copper layer.

U.S. Pat. No. 6,022,808 to Nogami et al. describes a doped copper damascene process. A via/contact hole and/or trench formed within a dielectric layer is filled with undoped copper. A doped (e.g. Pd, Zr, or Sn) copper layer is deposited on the undoped copper via/contact hole and/or line and the structure is annealed to diffuse the dopant from the overlying doped copper layer into the copper via/contact hole and/or line to improve its electomigration resistance.

SUMMARY OF THE INVENTION

Accordingly, it is an object of the present invention to provide a method to improve Cu via EM resistance.

Other objects will appear hereinafter.

It has now been discovered that the above and other objects of the present invention may be accomplished in the following manner. Specifically, a semiconductor structure having an exposed metal interconnect structure therein is provided. The metal interconnect structure including a metal via portion. A capping layer is formed over the metal interconnect structure. A via pattern structure is formed over the capping layer. The via pattern structure having a via pattern hole aligned with the metal via portion of the metal interconnect structure. Ions are implanted through the via pattern hole into the metal via portion, and any portion of the metal interconnect structure above the metal via portion. Whereby the metal via portion and the portion of the metal interconnect structure above the metal via portion have improved electromigration resistance.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
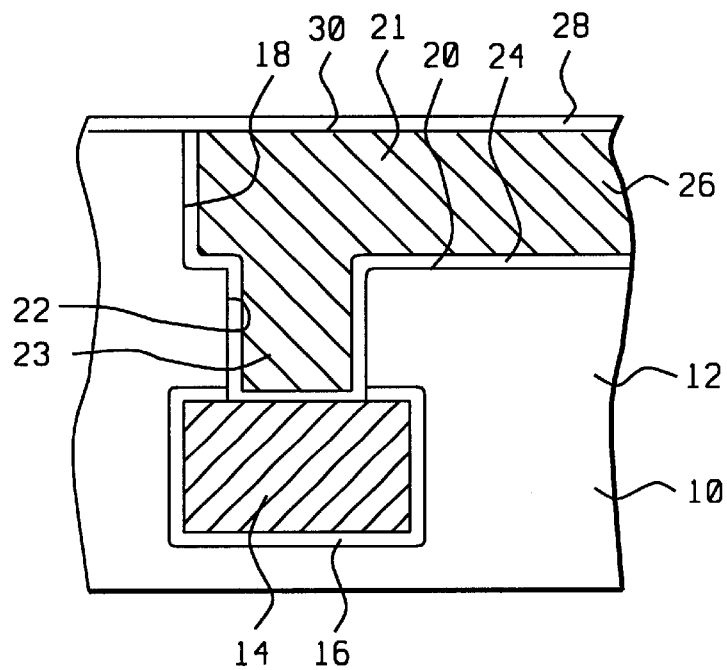
FIGS. 1 to 3 illustrate a preferred embodiment of the present invention.

As shown in FIG. 1, semiconductor structure 10 includes an upper dielectric layer 12 within which has been formed a lower metal interconnect 14, that may be comprised of copper for example, with lower barrier layer 16. Lower metal interconnect 14 is electrically connected to at least one device (not shown) within semiconductor structure 10.

Semiconductor structure 10 is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Dielectric layer 12 is patterned and etched to form dual damascene trench structure 18 that includes line trench portion 20 and via hole portion 22. It is understood that line trench portion 20 and via hole portion 22 may be formed by any conventional method other than a dual damascene process.

A metal barrier layer 24 may then be formed over the etched structure, lining line trench portion 20 and via hole portion 22 of dual damascene trench structure 18, and over lower metal interconnect 14. Metal barrier layer 24 may be formed of TiN, TaN, Ta, TaN/Ta or TiSiN, and is preferably TaN.

A metal layer (not shown) is then deposited over the structure, filling barrier layer 24 lined line trench portion 20 and via hole portion 22. The metal layer is then planarized, preferably by chemical mechanical polishing (CMP), to remove the excess of the metal layer from the top surface of dielectric layer 12 and to form planarized metal dual damascene structure 26. Metal dual damascene structure 26 includes via portion 23 and trench/line portion 21 and is be preferably formed of copper, aluminum or tungsten, and is more preferably formed of copper (Cu).

Formation of Capping Layer 28

As shown in FIG. 1, capping layer 28 is then formed over the top surface 30 of copper dual damascene structure 26. Capping layer 28 is preferably formed of SiN, SiC, SiN/SiC, or SiC/SiN, and is more preferably formed of SiN or SiC.

Formation of Via Pattern Structure 32

Figure 2:
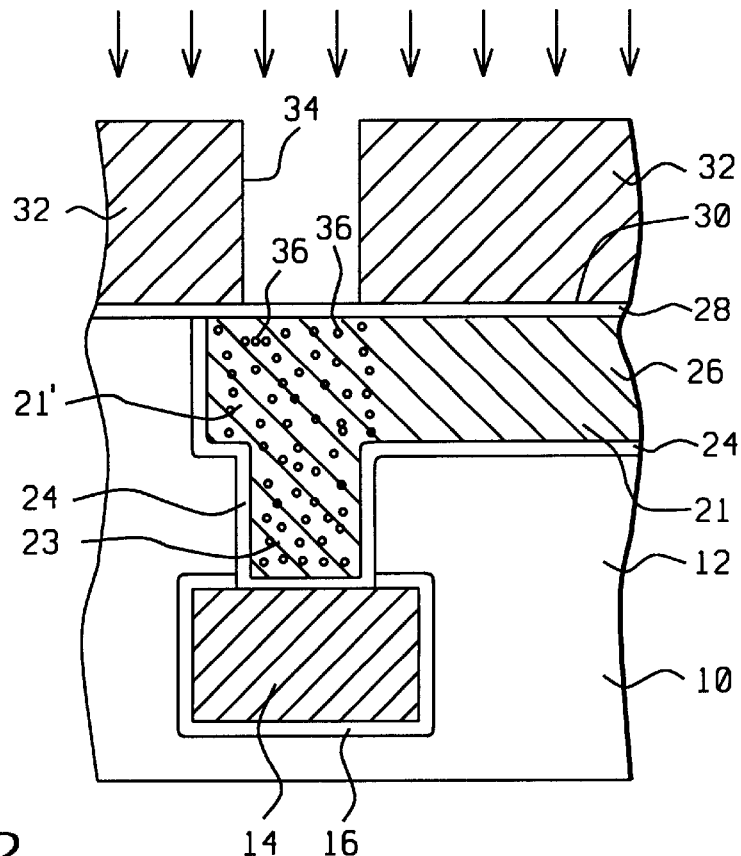

As shown in FIG. 2, via pattern structure 32 is formed over SiN capping layer 28. Via pattern structure 32 has via pattern hole 34 that is aligned with via hole portion 22 of dual damascene trench structure 18. Via pattern structure is preferably formed of patterned photoresist (PR) that may be a general DUV (deep ultraviolet) or I-line PR.

Using PR via pattern structure as a mask, impurity/ions 36 is implanted into Cu via portion 23 and into portion 21' of Cu trench/line portion 21 over Cu via portion 23. The balance of Cu line portion 21 is left impurity 36 free to avoid high Cu sheet resistance. Impurity 36 is preferably magnesium (Mg), boron, tin, zirconium, Al or C, and is more preferably Mg.

The implant dosage is preferably from about 1×10E14 (1E14) to 1×10E18 (1E18) atoms/cm$^2$, more preferably from about 1×10E15 to 1×10E17 atoms/cm$^2$, and is most preferably from about 1×10E15 to 1×10E16 atoms/cm$^2$.

The purpose of via pattern structure 32 is to permit concentration of impurity/ions 36 into Cu via portion 23 and portion 21' of Cu line portion 21 over Cu via portion 23 (resistance in via 23 is acceptable). If impurity/ions 36 is implanted into the balance of Cu line portion 21, the resistance of Cu line portion 21 is increased, which is not wanted.

Removal of Via Pattern Structure 32

Figure 3:
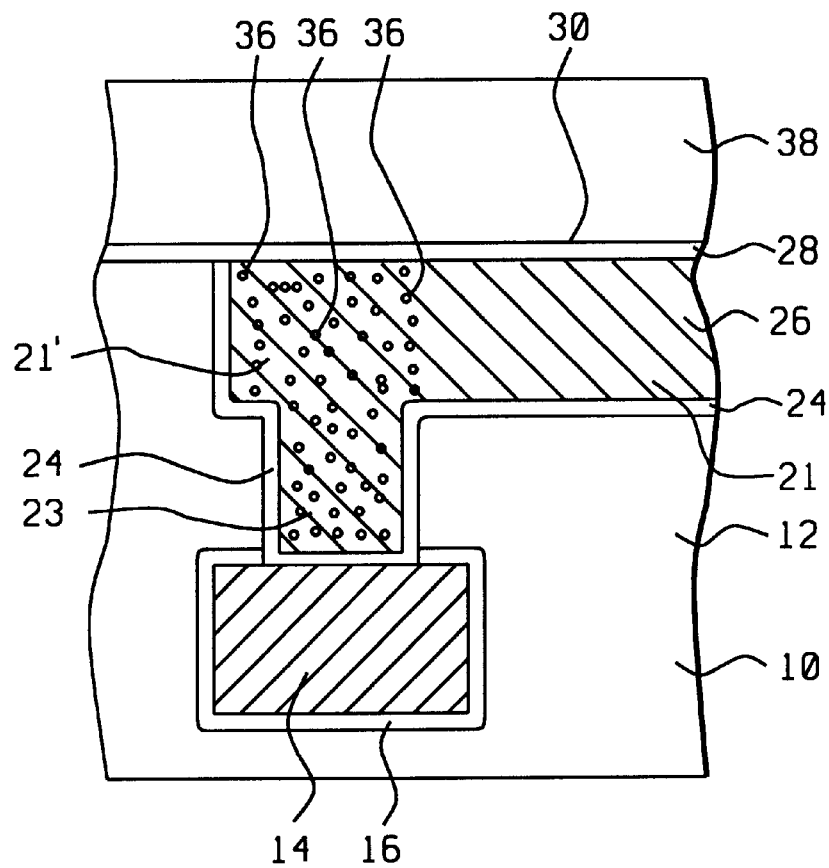

As shown in FIG. 3, via pattern structure 32 is removed from the structure of FIG. 2. For example, if via pattern structure 32 is composed of photoresist (PR), then PR via pattern structure is removed by ashing. In any event, SiN capping layer 28 protects Cu trench portion 21, 21' of planarized Cu dual damascene structure 26 against the via pattern structure 32 removal process, for example ashing of PR via pattern structure 32.

Further Processing

As shown in FIG. 3, further processing of the structure may proceed. For example, intermetal dielectric (IMD) layer 38 may be formed over SiN capping layer 28. Further metal interconnects (not shown) may be formed within IMD layer 38 connecting to planarized Cu dual damascene structure 26.

ADVANTAGES OF THE PRESENT INVENTION

The advantages of the present invention include:

1) the metal via EM resistance is improved without damaging the metal line;
2) the metal line is not damaged during removal of the via pattern structure due to the capping layer;
3) the metal via EM resistance is improved without the risk of metal line bridging by impurity/ion implantation; and
4) the metal via EM resistance is improved without suffering Cu line resistance increase.

While particular embodiments of the present invention have been illustrated and described, it is not intended to limit the invention, except as defined by the following claims.

We claim:

1. A method to fabricate a metal via structure having improved electromigration resistance, comprising the steps of:
   providing a semiconductor structure having an exposed metal interconnect structure therein; the metal interconnect structure including a metal via portion and a metal line portion;
   forming a capping layer over the metal interconnect structure;
   forming a via pattern structure over the capping layer; the via pattern structure having a via pattern hole aligned with the metal via portion of the metal interconnect structure; and
   implanting ions only through the via pattern hole into the metal via portion and any portion of the metal interconnect structure above the metal via portion and not into the metal line portion;
   whereby the metal via portion and the portion of the metal interconnect structure above the metal via portion have improved electromigration resistance.

2. The method of claim 1, including the steps of:
   removing the via pattern structure from the capping layer; and
   further processing the structure.

3. The method of claim 1, wherein the ions are implanted to a dose of from about 1E14 to 1E18 atoms/cm$^2$.

4. The method of claim 1, wherein the ions are implanted to a dose of from about 1E15 to 1E17 atoms/cm$^2$.

5. The method of claim 1, wherein the ions are implanted to a dose of from about 1E15 to 1E16 atoms/cm$^2$.

6. The method of claim 1, wherein: the metal interconnect structure is comprised of a material selected from the group consisting of: copper, aluminum, tungsten and C; the capping structure is comprised of a material selected from the group consisting of: SiN, SiC, SiN/SiC and SiC/SiN; the via pattern structure is comprised of photoresist; and the ions are selected from the group consisting of: magnesium, boron, tin, zirconium, Al and C.

7. The method of claim 1, wherein: the metal interconnect structure is comprised of copper; the capping layer is comprised of a material selected from the group consisting of SiN and SiC; the via pattern structure is comprised of photoresist; and the ions are magnesium.

8. The method of claim 1, wherein: the metal interconnect structure includes a metal via portion and a metal line portion; and wherein the ions are not implanted into the metal line portion not over the metal via portion.

9. The method of claim 1, wherein: the metal interconnect structure includes a metal via portion and a metal line portion; and wherein the ions are implanted into the metal line portion only over the metal via portion.

10. The method of claim 1, wherein the metal interconnect structure is electrically connected to at least one semiconductor device within the semiconductor structure.

11. The method of claim 1, wherein: the metal interconnect structure is a dual damascene structure that includes the metal via portion and a metal line portion; and wherein the ions are implanted into the metal line portion only over the metal via portion.

12. A method to fabricate a metal via structure having improved electromigration resistance, comprising the steps of:
    providing a semiconductor structure having an exposed metal interconnect structure therein; the metal interconnect structure including a metal via portion and a metal line portion;
    forming a capping layer over the metal interconnect structure;
    forming a via pattern structure over the capping layer; the via pattern structure having a via pattern hole aligned with the metal via portion of the metal interconnect structure;
    implanting ions only through the via pattern hole into the metal via portion and any portion of the metal interconnect structure above the metal via portion and not into the metal line portion; and
    removing the via pattern structure from the capping layer;
    whereby the metal via portion and the portion of the metal interconnect structure above the metal via portion have improved electromigration resistance.

13. The method of claim 12, including the step of further processing the structure after removal of the via pattern structure.

14. The method of claim 12, wherein the ions are implanted to a dose of from about 1E14 to 1E18 atoms/cm$^2$.

15. The method of claim 12, wherein the ions are implanted to a dose of from about 1E15 to 1E17 atoms/cm$^2$.

16. The method of claim 12, wherein the ions are implanted to a dose of from about 1E15 to 1E16 atoms/cm$^2$.

17. The method of claim 12, wherein: the metal interconnect structure is comprised of a material selected from the group consisting of: copper, aluminum, tungsten and C; the capping structure is comprised of a material selected from the group consisting of: SiN, SiC, SiN/SiC and SiC/SiN; the via pattern structure is comprised of photoresist; and the ions are selected from the group consisting of: magnesium, boron, tin, zirconium, Al and C.

18. The method of claim 12, wherein: the metal interconnect structure is comprised of copper; the capping layer is comprised of a material selected from the group consisting of SiN and SiC; the via pattern structure is comprised of photoresist; and the ions are magnesium.

19. The method of claim 12, wherein: the metal interconnect structure includes a metal via portion and a metal line portion; and wherein the ions are not implanted into the metal line portion not over the metal via portion.

20. The method of claim 12, wherein: the metal interconnect structure includes a metal via portion and a metal line portion; and wherein the ions are implanted into the metal line portion only over the metal via portion.

21. The method of claim 12, wherein the metal interconnect structure is electrically connected to at least one semiconductor device within the semiconductor structure.

22. The method of claim 12, wherein: the metal interconnect structure is a dual damascene structure that includes the metal via portion and a metal line portion; and wherein the ions are implanted into the metal line portion only over the metal via portion.

23. A method to fabricate a metal via structure having improved electromigration resistance, comprising the steps of:

provproviding a semiconductor structure having an exposed metal interconnect structure therein; the metal interconnect structure being comprised of a material selected from the group consisting of copper, aluminum and tungsten and including a metal via portion; the metal interconnect structure including a metal line portion; and forming a capping layer over the metal interconnect structure; the capping layer being comprised of a material selected from the group consisting of SiN, SiC, SiN/SiC and SiC/SiN;

forming a via pattern structure over the capping layer; the via pattern structure having a via pattern hole aligned with the metal via portion of the metal interconnect structure; the via pattern structure being comprised of photoresist;

implanting ions only through the via pattern hole into the metal via portion at a dose of from about 1E14 to 1E18 atoms/cm$^2$ and any portion of the metal interconnect structure above the metal via portion and not into the metal line portion; the ions being selected from the group consisting of magnesium, boron, tin, zirconium, Al and C; and removing the via pattern structure from the capping layer; whereby the metal via portion and the portion of the metal interconnect structure above the metal via portion have improved electromigration resistance.

24. The method of claim 23, including the step of further processing the structure after removal of the via pattern structure.

25. The method of claim 23, wherein the ions are implanted to a dose of from about 1E15 to 1E17 atoms/cm$^2$.

26. The method of claim 23, wherein the ions are implanted to a dose of from about 1E15 to 1E16 atoms/cm$^2$.

27. The method of claim 23, wherein: the metal interconnect structure is comprised of copper; the capping layer is comprised of a material selected from the group consisting of SiN and SiC; the via pattern structure is comprised of photoresist; and the ions are magnesium.

28. The method of claim 23, wherein: the metal interconnect structure includes a metal via portion and a metal line portion; and wherein the ions are not implanted into the metal line portion not over the metal via portion.

29. The method of claim 23, wherein: the metal interconnect structure includes a metal via portion and a metal line portion; and wherein the ions are implanted into the metal line portion only over the metal via portion.

30. The method of claim 23, wherein the metal interconnect structure is electrically connected to at least one semiconductor device within the semiconductor structure.

31. The method of claim 23, wherein: the metal interconnect structure is a dual damascene structure that includes the metal via portion and a metal line portion; and wherein the ions are implanted into the metal line portion only over the metal via portion.

* * * * *